Figure 1:
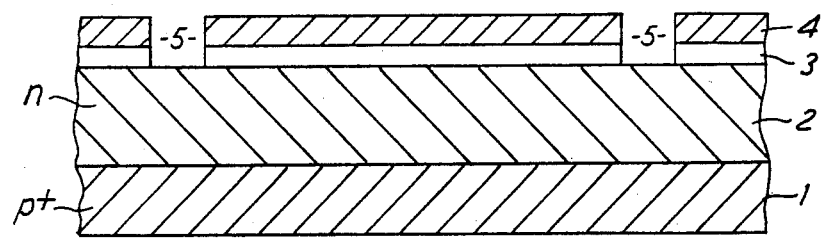
Figure 2:
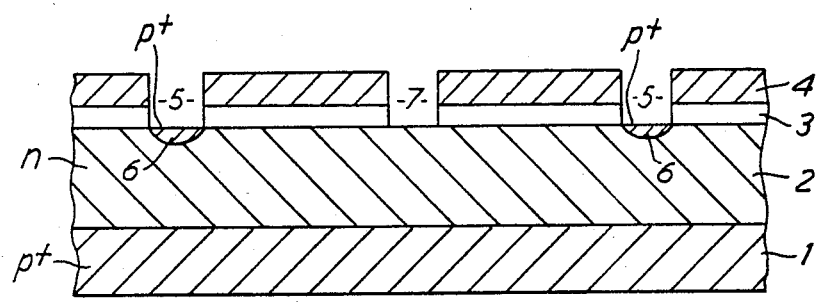
Figure 3:
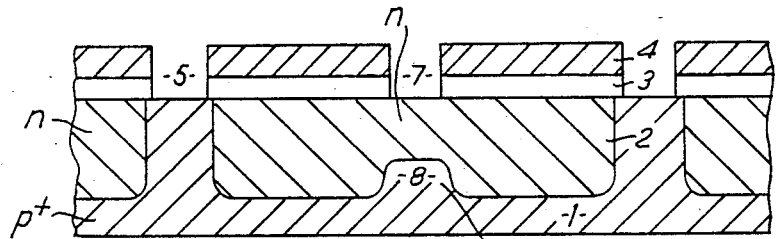

United States Patent [19]

Harrison et al.

[11] Patent Number: 4,602,419

[45] Date of Patent: Jul. 29, 1986

[54] METHOD OF MAKING JUNCTION FIELD EFFECT TRANSISTOR

[75] Inventors: Alan J. Harrison, Wycombe; Tawfic S. Nashashibi, Penn, both of England

[73] Assignee: EMI Limited, Hayes, England

[21] Appl. No.: 569,230

[22] Filed: Jan. 9, 1984

[30] Foreign Application Priority Data

Jan. 11, 1983 [GB] United Kingdom ................. 8300617

[51] Int. Cl.⁴ ............................................. H01L 21/38
[52] U.S. Cl. .................................. 29/571; 29/571 W; 29/583; 148/187; 148/191; 357/22
[58] Field of Search ................ 148/1.5, 187, 175, 191; 29/571, 583, 576 W; 357/22 R

[56] References Cited

U.S. PATENT DOCUMENTS

| | | | |
|---|---|---|---|
| 4,170,502 | 10/1979 | Watakabe | 29/571 X |
| 4,185,291 | 1/1980 | Hirao et al. | 357/22 |
| 4,393,578 | 7/1983 | Cady et al. | 29/571 X |
| 4,452,646 | 6/1984 | Zuleeg | 29/571 X |

*Primary Examiner*—George T. Ozaki
*Attorney, Agent, or Firm*—Fleit, Jacobson, Cohn & Price

[57] ABSTRACT

A junction field effect transistor has a substrate forming a junction with a layer of semiconductor material which has a gate, a source and a drain therein. The thickness of the n-type layer underlying the source is substantially greater than that underlying the gate (for example the ratio of n-thickness below the gate to that below the source is 1 to 2.53) in order to reduce the parasitic resistance as compared to conventional JFETs.

3 Claims, 4 Drawing Figures

METHOD OF MAKING JUNCTION FIELD EFFECT TRANSISTOR

The present invention relates to a junction field effect transistor (JFET) and to a method of manufacturing a JFET.

A known form of JFET has a P+-type silicon substrate on which an n-type silicon channel has been epitaxially grown. Spaced along the upper, exposed surface of the n-type layer are diffusion regions forming a source, a top gate and a drain. The portion of the n-type layer between the source and the top gate forms a parasitic resistance effectively in series with the channel and can cause degrading of the JFET's performance, particularly concerning its transconductance and thermal noise characteristics.

The present invention provides a junction field effect transistor comprising a substrate of semiconductor material forming a junction with a layer of semiconductor material which has a gate, a source and a drain therein, the thickness of semi-conductor layer underlying the source being substantially greater than that underlying the gate.

In this way, the thickness of semi-conductor material (for example n-type material) below the gate is at the magnitude necessary for the JFET to perform while ensuring that elsewhere the thickness of the n-type material is greater; as the parasitic resistance between the source and gate is inversely proportional to the thickness of n-type material below the source, the present invention provides a JFET with a lower parasitic resistance than previously.

Although conventional JFETs have some increase in n-type thickness below the source as compared to below the gate due to the thickness of the gate itself, the amount of increase (less than 1 $\mu$m) is small compared to that of the present invention; also the increase in the conventional JFET is not intended to, and does not, have any significant effect on the parasitic resistance. In the present invention, the ratio of n-type layer thickness below the gate to that thickness below the source may be between 1 to 1.75 and 1 to 3.5, preferably between 1 to 2 and 1 to 3.

Another aspect of the present invention provides a method of manufacturing a junction field effect transistor comprising:
depositing a first layer of semiconductor material on a substrate of semiconductor material to produce a junction,
forming an anti-oxidation layer over the first layer such that a portion of the first layer remains exposed,
effecting diffusion of the layered substrate under oxidation conditions to provide the first layer with a region of substantially greater thickness than that underlying the exposed portion.

Preferably the anti-oxidation layer is formed by applying (e.g. by sputtering or evaporating) a suitable material on the first layer, and then removing a portion of the anti-oxidation layer (e.g. by photo-lithography).

In one method, particularly suited to mass production, the first layer and anti-oxidation layer are applied to a wafer of substrate and then portions of the anti-oxidation layer are removed such that a number of transverse windows, exposing the top of the n-type layer, extend across the strip. An initial diffusion step is then made in order to at least partially split the n-type layers into separate segments corresponding to the segments of anti-oxidation layer between the windows. Then a further window (which eventually results in formation of the gate) is cut in each segment of the anti-oxidation layer, and the final diffusion step is done. If not already achieved, this diffusion step completes formation of the n-type layer into segments separated by p+-type material. Finally, the substrate and the layers are cut along the axes of the transverse windows, thereby resulting in a number of completed JFETs.

Preferably the anti-oxidation layer comprises silicon nitride.

In any form of the invention, a layer may be disposed between the first layer and the anti-oxidation layer to minimize stress at the interface of these layers which might otherwise occur. This layer may be silicon oxide.

In order that the invention may be more readily understood, a description is now given, by way of example only, reference being made to the accompanying drawings in which FIGS. 1 to 4 show schematically a silicon wafer in cross-section during stages in the manufacture of a JFET embodying the present invention.

A p+-type silicon wafer of (100) orientation is used as a substrate 1 for construction of a number of JFETs embodying the present invention. An epitaxial layer 2 of n-type silicon is grown on one side of substrate to a thickness of 6 $\mu$m such that a p-n junction is formed between them. The exposed surface of layer 2 is then covered by a layer 3 of silicon oxide ($SiO_2$) which is used to minimize the stress that would otherwise occur due to the interface between layer 2 and subsequent layer 4 of silicon nitride ($Si_3N_4$). This layer 4 of thickness 0.1 $\mu$m prevents oxidation of the upper surface of layer 2 and inhibits diffusion of the layer 2 in the later stages of the manufacture.

Using conventional photo-lithographic techniques, strips of the layers 3 and 4 are cut out such that a lattice pattern of exposed layer 2 exists, the resulting segments of layers 3 and 4 corresponding to what will eventually be individual components.

Thus the layers 3 and 4 now form a mask with windows 5, the substrate being as schematically shown in FIG. 1. Boron is then deposited on the wafer by evaporation for one hour while the wafer is maintained at a temperature in the range 950° to 1250° C., so that diffusion occurs at the exposed portions of the n-type layer 2 resulting in regions 6 of p-type silicon within the n-type layer 2 (see FIG. 2). This Figure also shows the completion of the next stage, in which a window 7 is cut in each segment of layers 3 and 4 so that more of the layer 2 is exposed. Each window 7 will result in the formation of a gate region in due course.

Then the wafer is submitted to the main diffusion step under oxidizing conditions. The material underlying the nitride layers has the intrinsic value of diffusion coefficient for that material. However enhanced diffusion occurs in the material underlying the surfaces of the n-type layer 2 which are oxidizing, i.e., those which have no overlying nitride layer 4; the diffusion coefficient in this material is three times the intrinsic value. Thus at the end of the diffusion step there is a non-uniform distribution of p-type material in the wafer (see FIG. 3), the enhanced diffusion underlying windows 5 having partitioned the n-type layer 2 into isolated segments which in due course will form individual JFETs. Also the enhanced diffusion underlying window 7 has produced a region 8 of p-type material extending into the n-type material relative to the remainder of the p-type material. A conventional JFET of identical characteristics (except, of course, for parasitic resistance) to the illustrated JFET would have an n-type layer of uniform thickness equivalent to the thickness of the n-type layer between window 7 and region 8. By providing a JFET with a n-type layer of non-uniform thickness, the present invention results in a reduced parasitic resistance for a transistor of a given performance.

Figure 4:
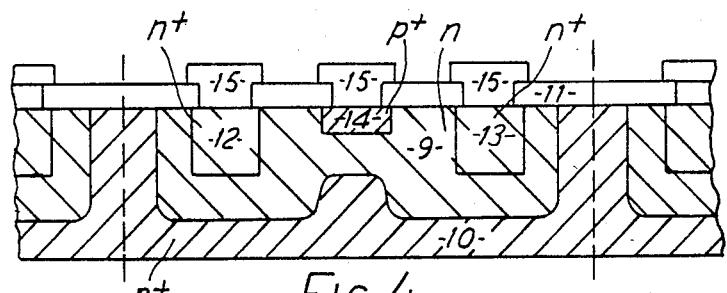

A mask exposing substantially only window 7 is placed over the layer 4 and boron is then deposited on the n-type material by evaporation to form the gate. The silicon nitride layer 4 is stripped off, the source and drain regions are then formed, and the substrate is cut along the axes of the windows 5 thereby separating the completed JFETs. FIG. 4 shows schematically a completed JFET prior to cutting; the JFET has an n-type layer 9 of thickness 3.8 μm which is enclosed in a p-type layer 10 and a silicon oxide layer 11. Regions of the n-type layer 9 form a source 12 and a drain 15. Some p-type material also extends into this n-type layer 9 to form a gate 14. Each of the source 12, drain 13 and gate 14 has an aluminum contact 15. The n-type layer 9 has a thickness of 1.5 μm underlying the gate 14, so the ratio of thickness under the gate to thickness under the source is 1 to 2.53. In a conventional JFET without a region 8, there would be a slightly greater thickness under the source than that under the gate due to the thickness of the p-type material (0.7 μm) forming gate 14, but this produces a ratio of only 1 to 1.47.

Thus, the parasitic resistance of the above described JFET embodying the present invention is 0.58 that of the described conventional JFET.

A transistor made by the process described above may generate less low frequency noise than a conventional transistor. It is believed that this is because the silicon nitride layer acts as a form of barrier against impurities contaminating the silicon layers below; thus there may be a reduction in the number of defects produced in the material of the transistor as compared to a conventionally made transistor, such defects being responsible for the generation of low frequency noise. For example, taking the comparison of transistors mentioned above, the JFET embodying the invention has approximately a 20% reduction in the low frequency noise as compared to the conventional JFET.

A JFET embodying the present invention can have a p-type epitaxial layer on an n+-type silicon substrate.

We claim:

1. A method of manufacturing junction field effect transistors comprising:
    depositing a first layer of semiconductor material on a substrate of semiconductor material to produce a junction;
    forming an anti-oxidation layer over the first layer, the anti-oxidation layer having a plurality of first windows which expose portions of the first layer;
    effecting diffusion of the layered substrate under oxidation conditions;
    removing a plurality of sections of the anti-oxidation layer to produce second windows in the anti-oxidation layer such as to expose further portions of the first layer;
    effecting diffusion of the resultant layered substrate under oxidation conditions, whereby enhanced diffusion occurs in the material underlying the first windows and the second windows, to such a degree whereby the first layer is fragmented into distinct divisions separated by diffused semiconductor material corresponding to that of the first layer and underlying the first windows but not the second windows, a such division of the first layer having a region of reduced thickness underlying the second window corresponding to that division;
    forming, for each such division of the first layer, a gate in the vicinity of the appropriate second window and a source and drain elsewhere on the division; and then
    cutting up the layered substrate along lines constituted by the enhanced-diffusion material formed by the first windows, thereby to separate the said divisions.

2. A method according to claim 1, wherein the diffusion steps are of such duration as to produce, in a completed junction field effect transistor, a ratio of semiconductor layer thickness below the gate to that thickness below the source in the range between 1 to 1.75 and 1 to 3.5.

3. A method according to claim 1, wherein the diffusion steps are of such duration as to produce, in a completed junction field effect transistor, a ratio of semiconductor layer thickness below the gate to that thickness below the source in the range between 1 to 2 and 1 to 3.

* * * * *